United States Patent
Sunaga et al.

(10) Patent No.: US 10,050,718 B2
(45) Date of Patent: Aug. 14, 2018

(54) OPTICAL COMMUNICATION MODULE

(71) Applicant: APRESIA Systems, Ltd., Tokyo (JP)

(72) Inventors: Yoshinori Sunaga, Hitachinaka (JP); Masataka Sato, Yasugi (JP); Kinya Yamazaki, Hitachi (JP); Akira Ogura, Hitachi (JP); Shinji Komatsuzaki, Mito (JP)

(73) Assignee: APRESIA SYSTEMS, LTD., Tokyo (JP)

( * ) Notice: Subject to any disclaimer, the term of this patent is extended or adjusted under 35 U.S.C. 154(b) by 0 days.

(21) Appl. No.: 15/494,074

(22) Filed: Apr. 21, 2017

(65) Prior Publication Data

US 2017/0317763 A1 Nov. 2, 2017

(30) Foreign Application Priority Data

Apr. 28, 2016 (JP) .................. 2016-091766

(51) Int. Cl.
| | |
|---|---|
| *H04B 10/50* | (2013.01) |
| *H04B 10/40* | (2013.01) |
| *H04B 10/69* | (2013.01) |
| *H01S 5/024* | (2006.01) |
| *H05K 1/02* | (2006.01) |
| *G02B 6/42* | (2006.01) |

(52) U.S. Cl.
CPC ......... *H04B 10/693* (2013.01); *G02B 6/4269* (2013.01); *H01S 5/024* (2013.01); *H04B 10/40* (2013.01); *H04B 10/504* (2013.01); *G02B 6/4214* (2013.01); *G02B 6/4292* (2013.01); *H05K 1/0206* (2013.01); *H05K 2201/10121* (2013.01); *H05K 2201/10409* (2013.01)

(58) Field of Classification Search
CPC .................................................... H04B 10/504
See application file for complete search history.

(56) References Cited

U.S. PATENT DOCUMENTS

| | | | | |
|---|---|---|---|---|
| 9,496,959 | B1 * | 11/2016 | Nagarajan | H04B 10/40 |
| 9,918,377 | B1 * | 3/2018 | Shen | H05K 1/0206 |
| 2005/0018972 | A1 * | 1/2005 | Anderson | G02B 6/4249 |
| | | | | 385/53 |
| 2010/0086310 | A1 * | 4/2010 | Lee | H04B 10/40 |
| | | | | 398/138 |

(Continued)

FOREIGN PATENT DOCUMENTS

| | | | | |
|---|---|---|---|---|
| JP | 2014036033 | A | 2/2014 | |
| JP | 2015092524 | A | 5/2015 | |
| JP | 2016015405 | S | * 1/2016 | H01S 5/022 |

*Primary Examiner* — Nathan Cors
(74) *Attorney, Agent, or Firm* — Nixon Peabody LLP; Eduardo J. Quiñones

(57) ABSTRACT

An optical communication module includes a module board housed in a casing, a VCSEL and a driving IC mounted on a mounting surface of the module board, a lens holder mounted on the mounting surface of the module board, a lens block held by the lens holder, a plurality of thermal vias passing through the module board, and a first fixing screw and a second fixing screw passing through the module board to be screwed into the casing so as to press a back surface of the module board against a bottom surface of the casing, and the first fixing screw and the second fixing screw are each arranged in a region between the plug connector and the lens holder and on either outer side of the lens holder.

16 Claims, 3 Drawing Sheets

(56) References Cited

U.S. PATENT DOCUMENTS

| | | | |
|---|---|---|---|
| 2014/0056592 A1* | 2/2014 | McColloch | H04B 10/40 398/135 |
| 2014/0079403 A1* | 3/2014 | Daghighian | H05K 1/0283 398/115 |
| 2016/0105241 A1* | 4/2016 | Keil | G02B 6/4272 250/553 |
| 2016/0191166 A1* | 6/2016 | Wang | G02B 6/42 398/135 |
| 2017/0047312 A1* | 2/2017 | Budd | G02B 6/4204 |
| 2017/0219787 A1* | 8/2017 | Ogura | G02B 6/4246 |

* cited by examiner

OPTICAL COMMUNICATION MODULE

CROSS-REFERENCE TO RELATED APPLICATION

The present application claims priority from Japanese Patent Application No. 2016-091766 filed on Apr. 28, 2016, the content of which is hereby incorporated by reference into this application.

TECHNICAL FIELD OF THE INVENTION

The present invention relates to an optical communication module having a photoelectric conversion function.

BACKGROUND OF THE INVENTION

A general optical communication module has a board and a casing that houses the board. A board included in an optical communication module is generally called a "module board" and is distinguished from a board (generally called a "host board") included in a communication device, a transmission apparatus, etc. to which a communication module is connected. In the following description, in accordance with the above-mentioned distinction, the board included in the optical communication module may be referred to as a "module board," and the board included in the communication device or the transmission apparatus may be referred to as a "host board" in some cases. Also, a communication device, a transmission apparatus, and the like to which a communication module is connected may be collectively referred to as a "communication device."

A plurality of elements are mounted on the module board. For example, a light emitting element and a driving element driving the light emitting element are mounted on the module board, and a light receiving element and an amplifying element amplifying electric signals output from the light receiving element are mounted thereon. Further, a lens optically coupling the light emitting element and the light receiving element with an optical fiber is provided on the module board.

Various elements mounted on the module board emit heat during the operation, and in particular, the driving element generates a large amount of heat. In view of this, a technique has been proposed in which heat generated from an element mounted on the module board is transferred to the casing by a thermal via provided in the module board so as to be radiated from the surface of the casing (Japanese Patent Application Laid-Open Publication No. 2015-92524).

In addition, a technique has been proposed in which a board on which an electronic component is mounted and a casing that houses the board are fastened by a bolt screw to reduce a contact thermal resistance between the board and the casing (Japanese Patent Application Laid-Open Publication No. 2014-36033). To be specific, Japanese Patent Application Laid-Open Publication No. 2014-36033 discloses a way of pressing the board against the casing while applying pressure to the board by tightening a bolt screw.

SUMMARY OF THE INVENTION

When a module board is fixed to a casing with screws and the module board is pressed against the casing, reduction in thermal resistance between the module board and the casing can be expected.

However, when the module board is fixed to the casing with the screws, a position of the screw becomes a fixed point of the module board with respect to the casing. In this case, when force is applied to the module board, stress concentrates on the fixed point. For example, when a plug connector provided on the module board is inserted into or removed from a receptacle connector provided on a host board, force is applied to the module board provided with the plug connector. At this time, when the module board is fixed to the casing with the screws, stress concentrates at the fixed point (screw position or its vicinity).

Meanwhile, the module board constituting the optical communication module is thinner than the circuit board constituting the power semiconductor or the like, and there is a possibility that the board is distorted or tilted even by small force. In addition, the module board constituting the optical communication module is provided with a lens optically coupling the light emitting element and the light receiving element with an optical fiber, and the lens is held by a holding member fixed to the module board. The lens optically coupling the light emitting element and the light receiving element with the optical fiber is positioned with high accuracy with respect to the light emitting element, the light receiving element, and the optical fiber. In other words, the respective optical axes of the lens, the light emitting element, the light receiving element, and the optical fiber are aligned with one another with high accuracy.

Therefore, there is a concern that, when force is applied to the module board, if distortion or tilting of the module board occurs at the position where the holding member that holds the lens is located or in the vicinity thereof, the optical axes of the lens, the light emitting element, the light receiving element, and the optical fiber may be shifted. Further, when the holding member is adhered to the module board, there is a possibility that the mating surface may be peeled off.

In other words, when the module board is fixed to the casing with the screws, reduction in thermal resistance between the module board and the casing can be expected, but another problem specific to the optical communication module such as the misalignment of the optical axes may arise depending on the fixed position.

An object of the present invention is to reduce the thermal resistance between the module board and the casing by pressing the module board against the casing while preventing distortion and tilting of the module board at the position where the holding member is located or in the vicinity thereof.

An optical communication module according to the present invention has a photoelectric conversion function and includes a casing made of metal, a board housed in the casing and having an electrical connector at one end thereof, a light emitting element mounted on a front surface of the board, a driving element mounted on the front surface of the board and driving the light emitting element, a holding member mounted on the front surface of the board so as to cover the light emitting element and the driving element, an optical fiber optically coupled with the light emitting element, an optical member held by the holding member and optically coupling the light emitting element with the optical fiber, a plurality of thermal vias which pass through the board and each of which has a first end face exposed on the front surface of the board and a second end face exposed on a back surface of the board, and a first fixing screw and a second fixing screw which pass through the board and are screwed into the casing and which press the back surface of the board against a bottom surface of the casing. At least one of the thermal vias has the first end face thermally connected to the driving element and the second end face thermally connected to the bottom surface of the casing, and the first fixing screw and the second fixing screw are each disposed in a region between the electrical connector and the holding member and on either outer side of the holding member.

According to an aspect of the present invention, the first fixing screw and the second fixing screw are disposed line-symmetrically with respect to a center line of the board as a symmetry axis.

According to another aspect of the present invention, the holding member includes a rear face to which an optical connector provided at an end of the optical fiber is connected, a front face located opposite to the rear face, and a first side face and a second side face each intersecting the rear face and the front face. Then, the first fixing screw is disposed in a region between the electrical connector and the front face and in an outer region than the first side face, and the second fixing screw is disposed in a region between the electrical connector and the front face and in an outer region than the second side face.

According to another aspect of the present invention, the optical communication module includes a heat conductive material interposed between the back surface of the board and the bottom surface of the casing.

According to another aspect of the present invention, the optical communication module includes a light receiving element mounted on the front surface of the board, and an amplifying element mounted on the front surface of the board and amplifying an electric signal output from the light receiving element. The holding member is mounted on the front surface of the board so as to cover the light emitting element, the driving element, the light receiving element, and the amplifying element. The plurality of thermal vias include at least one thermal via in which the first end face is thermally connected to the amplifying element and the second end face is thermally connected to the bottom surface of the casing.

According to the present invention, thermal resistance between the module board and the casing can be reduced by pressing the module board against the casing while distortion and tilting of the module board at the position where the holding member is located or in the vicinity thereof is prevented.

BRIEF DESCRIPTIONS OF THE DRAWINGS

DESCRIPTIONS OF THE PREFERRED EMBODIMENT

Figure 1:
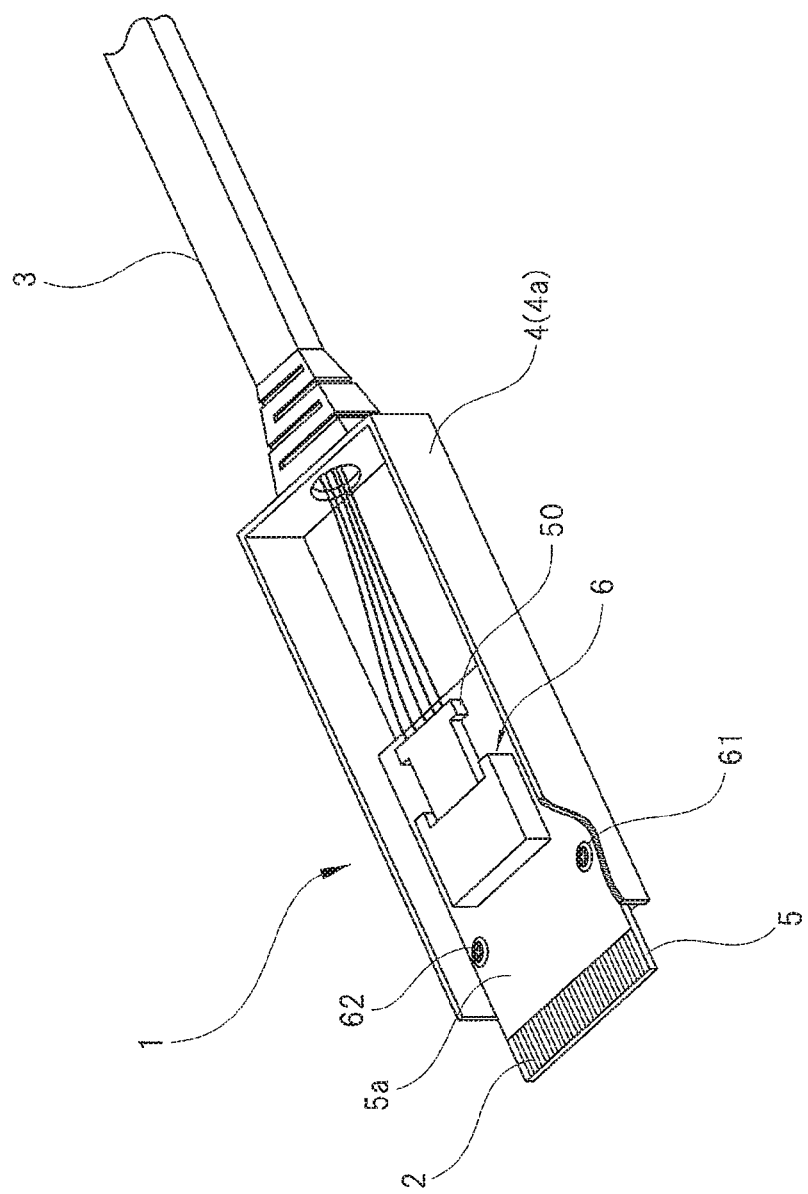
FIG. 1 is a perspective view showing an example of an optical communication module.

Hereinafter, an embodiment of the present invention will be described by way of example. An optical communication module 1 shown in FIG. 1 is connected to a host board provided in a communication device or a transmission apparatus such as a server or a network switch. The optical communication module 1 has a photoelectric conversion function so as to convert an optical signal into an electric signal and convert an electric signal into an optical signal. An electrical connector (plug connector 2) is provided at the tip of the optical communication module 1, and the plug connector 2 is connected to an electrical connector (receptacle connector) provided on the host board. That is, the optical communication module 1 according to the present embodiment includes the plug connector 2 that can be inserted into and removed from the receptacle connector provided in the host board, and when the plug connector 2 is inserted into the receptacle connector, a module board 5 and the host board are connected. That is, the optical communication module 1 and the communication device are connected. Conversely, when the plug connector 2 is removed from the receptacle connector, the connection between the module board 5 and the host board is released. That is, the connection between the optical communication module 1 and the communication device is released. Further, the optical communication module 1 connected to the communication device performs parallel communication at high speed (25 Gbit/s or higher).

A semiconductor chip for communication is mounted on the host board of the communication device to which the optical communication module 1 is connected, and the optical communication module 1 connected to the communication device is connected to the semiconductor chip for communication via a signal wire formed on the host board. In addition, a plurality of receptacle connectors are provided on the host board, and the plurality of optical communication modules 1 are connected to the semiconductor chip for communication via the respective receptacle connectors.

The optical communication module 1 has a casing 4 to which one end side of an optical fiber cable 3 is connected, and a board (module board 5) housed in the casing 4. The module board 5 is a multilayer board, and the plug connector 2 is an edge connector provided on one side of the module board 5. Note that the casing 4 is composed of a lower case 4a that is illustrated and an upper case that is not illustrated. The lower case 4a and the upper case are made of metal and constitute the casing 4 having a space capable of housing the module board 5 by being butted to each other.

A photoelectric conversion unit 6 is provided on the module board 5. Although not shown in FIG. 1, the photoelectric conversion unit 6 is composed of a light emitting element, a driving element, a light receiving element, an amplifying element, and the like mounted on a front surface 5a of the module board 5. In the following description, the front surface 5a of the module board 5 on which the photoelectric conversion unit 6 is provided may be referred to as a "mounting surface 5a."

Figure 2:
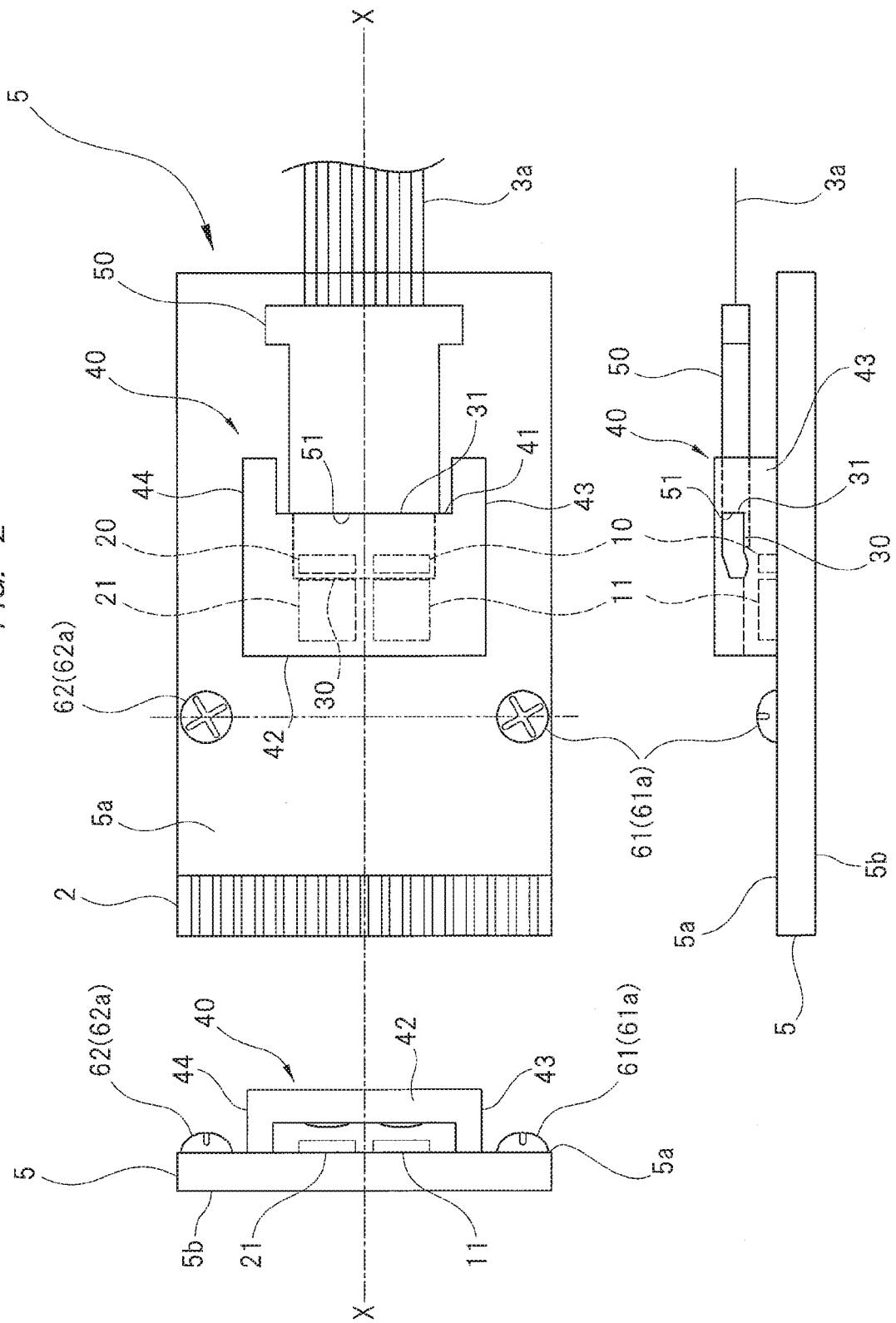
FIG. 2 is a view showing a module board as viewed from three different directions.

As shown in FIG. 2, a vertical cavity surface emitting laser (VCSEL) 10 as the light emitting element, a driving IC 11 as the driving element, a photodiode (PD) 20 as the light receiving element, and a transimpedance amplifier (TIA) 21 as the amplifying element are mounted on the mounting surface 5a of the module board 5. Further, a lens block 30 as an optical member optically coupling the VCSEL 10 and the PD 20 with an optical fiber 3a which is the core wire of the optical fiber cable 3 (FIG. 1) is provided on the mounting surface 5a. The lens block 30 has a plurality of lens elements and a reflecting surface and is held by a holding member 40 made of a resin and mounted on the mounting surface 5a of the module board 5. The holding member 40 holds the lens block 30 at a predetermined position on the module board 5 and is adhesively fixed to the mounting surface 5a of the module board 5. In the following description, the holding member 40 may be referred to as a "lens holder 40" in some cases.

The lens holder 40 is mounted on the mounting surface 5a so as to cover the VCSEL 10, driving IC 11, PD 20, and TIA 21 mounted on the mounting surface 5a, and the optical fiber 3a is connected to a rear face 41 of the lens holder 40. In other words, one surface to which the optical fiber 3a is connected is the rear face 41 of the lens holder 40. Specifically, an optical connector 50 provided at the end of the optical fiber 3a is butted to a joint surface 31 of the lens block 30 exposed on the rear face 41 of the lens holder 40, and the VCSEL 10 and the PD 20 are optically coupled with the optical fiber 3a via the lens block 30. More specifically, the optical connector 50 is a mechanically transferable (MT) connector, and a tip surface 51 of the optical connector 50 is butted to the joint surface 31 of the lens block 30. Two guide holes are provided in the tip surface 51 of the optical connector 50 while two guide pins protrude from the joint surface 31 of the lens block 30, and each guide pin is inserted into a corresponding guide hole. However, a connecting structure between the lens block 30 and the optical fiber 3a is not limited to the above structure, and any other known or new connecting structure can be adopted arbitrarily.

A plurality of signal wires are provided on the mounting surface 5a of the module board 5. For example, a signal wire electrically connecting the driving IC 11 and the plug connector 2, a signal wire electrically connecting the TIA 21 and the plug connector 2, and the like are provided on the mounting surface 5a. In addition, the driving IC 11 and the VCSEL 10 are mounted on the mounting surface 5a by bare-chip mounting, and the driving IC 11 and the VCSEL 10 are electrically connected via a bonding wire. Similarly, the TIA 21 and the PD 20 are mounted on the mounting surface 5a by bare-chip mounting, and the TIA 21 and the PD 20 are electrically connected via a bonding wire. Here, the bare-chip mounting means a mounting structure or a mounting method in which elements (VCSEL 10, PD 20, etc.) and ICs (driving IC 11, TIA 21, etc.) are mounted on a board in a state of a chip as it is and electrodes on the chip and electrodes on the board are connected via bonding wires or the like.

The electric signal input to the plug connector 2 is transmitted to the driving IC 11 via the signal wire provided on the mounting surface 5a. The driving IC 11 to which the electric signal is input outputs an electric signal (drive signal) in response to the input electric signal. The drive signal output from the driving IC 11 is transmitted to the VCSEL 10 via the bonding wire. The VCSEL 10 to which the drive signal is input outputs an optical signal in response to the input drive signal. The traveling direction of the optical signal output from the VCSEL 10 is changed by the lens block 30, and the optical signal is made incident on the optical fiber 3a.

Meanwhile, the optical signal emitted from the optical fiber 3a is made incident on the light receiving element 20 after its traveling direction is changed by the lens block 30. The light receiving element 20 to which the optical signal is input outputs an electric signal in response to the input optical signal. The electric signal output from the light receiving element 20 is transmitted to the TIA 21 via the bonding wire. The TIA 21 to which the electric signal is input amplifies the input electric signal and outputs the amplified signal. The electric signal output from the TIA 21 is transmitted to the plug connector 2 via the signal wire.

Note that the signal wire described here is a part of the signal wire provided on the module board 5. Signal wires and ground wires (ground layers) other than the above-mentioned signal wires are provided on the mounting surface 5a of the module board 5 as needed, and signal wires and ground wires (ground layer) are provided on the inner layer of the module board 5 as needed.

Figure 3:
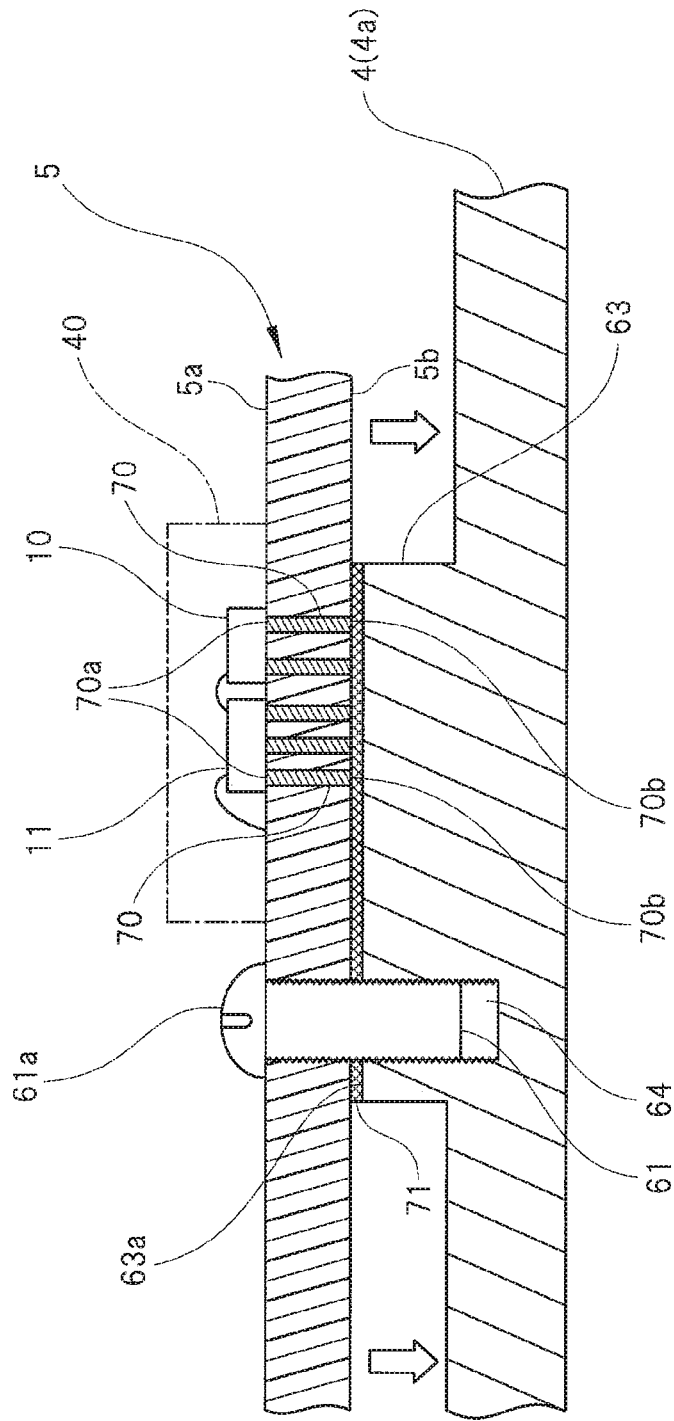
FIG. 3 is a cross-sectional view showing a relation between a casing and the module board.

FIG. 1 is referred to again. The module board 5 is fixed to the casing 4 by a first fixing screw 61 and a second fixing screw 62 passing through the module board 5. The first fixing screw 61 and the second fixing screw 62 pass through the module board 5 and are screwed into the bottom of the casing 4. As shown in FIG. 3, a stage 63 higher than the periphery is integrally formed at the bottom of the casing 4 (lower case 4a), and the module board 5 is placed on the stage 63. A screw hole 64 having a female screw is formed in the stage 63, and the first fixing screw 61 is screwed into the screw hole 64. Though not shown in FIG. 3, a screw hole corresponding to the second fixing screw 62 (FIG. 2) is also formed in the stage 63, and the second fixing screw 62 is screwed into this screw hole. That is, two screw holes are formed in the stage 63, the first fixing screw 61 is screwed into one screw hole, and the second fixing screw 62 is screwed into the other screw hole.

Therefore, when the first fixing screw 61 and the second fixing screw 62 shown in FIGS. 2 and 3 are tightened, the module board 5 is sandwiched between heads 61a and 62a of the respective fixing screws 61 and 62 and the stage 63, and a back surface 5b of the module board 5 is pressed against an upper surface 63a of the stage 63 which is a part of the bottom surface of the casing 4. It is apparent from the drawing that the back surface 5b of the module board 5 pressed against the upper surface 63a of the stage 63 is one surface of the module board 5 opposite to the mounting surface 5a.

As shown in FIG. 3, a plurality of thermal vias 70 passing through the module board 5 are formed in the module board 5. A first end face 70a of each thermal via 70 is exposed on the mounting surface 5a of the module board 5, and a second end face 70b of each thermal via 70 is exposed on the back surface 5b of the module board 5. In other words, one end face of the thermal via 70 exposed on the mounting surface 5a of the module board 5 is the first end face 70a, and the other end face of the thermal via 70 exposed on the back surface 5b of the module board 5 is the second end face 70b.

As shown in FIG. 3, the first end face 70a of at least one thermal via 70 is in contact with a bottom surface of the driving IC 11 and is thermally connected to the driving IC 11. Also, the second end face 70b of the thermal via 70 thermally connected to the driving IC 11 is thermally connected to the upper surface 63a of the stage 63. In addition, the first end face 70a of at least one different thermal via 70 is in contact with a bottom surface of the VCSEL 10 and is thermally connected to the VCSEL 10. Also, the second end face 70b of the thermal via 70 thermally connected to the VCSEL 10 is thermally connected to the upper surface 63a of the stage 63. Here, a heat radiation sheet 71 as a heat conductive material is interposed between the back surface 5b of the module board 5 and the upper surface 63a of the stage 63. As a result, the second end face 70b of each thermal via 70 is thermally connected to the upper surface 63a of the stage 63 via the heat radiation sheet 71. Note that a thickness of the heat radiation sheet 71 in the present embodiment is 100 µm or less.

As described above, when the first fixing screw 61 and the second fixing screw 62 shown in FIGS. 2 and 3 are tightened, the back surface 5b of the module board 5 is pressed against the upper surface 63a of the stage 63. In the present embodiment in which the heat radiation sheet 71 is interposed between the back surface 5b of the module board 5 and the upper surface 63a of the stage 63, the back surface 5b of the module board 5 and the second end face 70b of each thermal via 70 are pressed against the heat radiation sheet 71. As a result, thermal resistance between the back surface 5b of the module board 5 and the second end face 70b of each thermal via 70, and the upper surface 63a of the stage 63 is reduced, and heat radiation effect is improved. That is, thermal resistance between the module board 5 and the casing 4 is reduced, and heat radiation effect of heat emitted from the element mounted on the module board 5 is improved.

Further, as shown in FIG. 1, the first fixing screw 61 and the second fixing screw 62 are disposed between the plug connector 2 and the photoelectric conversion unit 6. To be more specific, as shown in FIG. 2, the first fixing screw 61 and the second fixing screw 62 are each disposed in a region between the plug connector 2 and the lens holder 40 and on either outer side of the lens holder 40. Further, the first fixing screw 61 and the second fixing screw 62 are disposed line-symmetrically with respect to a center line X of the module board 5, which divides one side of the module board 5 on which the plug connector 2 is provided into two, as the symmetry axis. Hereinafter, positions of the first fixing screw 61 and the second fixing screw 62 on the module board 5 will be described in more detail.

In addition to the rear face 41, the lens holder 40 is provided with a front face 42 positioned on the side opposite to the rear face 41. Further, the lens holder 40 includes a first side face 43 and a second side face 44 which intersect the rear face 41 and the front face 42, respectively, and are parallel to each other. The first fixing screw 61 is disposed in a region between the plug connector 2 and the front face 42 of the lens holder 40 and in an outer region than the first side face 43 of the lens holder 40. On the other hand, the second fixing screw 62 is disposed in a region between the plug connector 2 and the front face 42 of the lens holder 40 and in an outer region than the second side face 44 of the lens holder 40. As a result, an extension line of the first side face 43 of the lens holder 40 passes through a region on the inner side of the head 61a of the first fixing screw 61, and an extension line of the second side face 44 of the lens holder 40 passes through a region on the inner side of the head 62a of the second fixing screw 62.

As described above, since the module board 5 is pressed against the casing 4 by the first fixing screw 61 and the second fixing screw 62 in the present embodiment, the thermal resistance between the module board 5 and the casing 4 is reduced, and the heat radiation effect of the heat emitted from the element mounted on the module board 5 is improved. Improvement of the heat radiation effect is effective in parallel communication that generates a large amount of heat and is particularly effective in high-speed parallel communication with a larger amount of heat generation (25 Gbit/s or more).

Further, in the present embodiment, the first fixing screw 61 and the second fixing screw 62 which fix the module board 5 to the casing 4 are disposed between the plug connector 2 and the lens holder 40. In other words, the fixed point of the module board 5 with respect to the casing 4 is located between the plug connector 2 and the lens holder 40. Therefore, the force applied to the module board 5 when the plug connector 2 is inserted or removed is prevented from reaching the position of the lens holder 40, or the force reaching the position of the lens holder 40 is at least reduced. Hence, occurrence of distortion and tilting of the module board 5 at the position where the lens holder 40 is located and its vicinity is prevented or suppressed, and the optical axis misalignment and peeling-off of the lens holder 40 are prevented, and thus, a degree of accuracy of the optical system is improved as a whole. Improvement in degree of accuracy of such an optical system is particularly effective in parallel communication which is easily affected by distortion of the optical system. Also, prevention or suppression of occurrence of distortion and tilting of the module board 5 is suitable for bare-chip mounting in which objects to be mounted are extremely small and precise mounting is required.

Further, the first fixing screw 61 and the second fixing screw 62 which press the module board 5 against the casing 4 are disposed line-symmetrically with respect to the center line X of the module board 5 as the symmetry axis. Accordingly, pressure caused by tightening the first fixing screw 61 and pressure caused by tightening the second fixing screw 62 equally act on the module board 5. Therefore, since the module board 5 is not distorted or tilted due to the tightening of the first fixing screw 61 and the second fixing screw 62, no optical axis misalignment occurs in the photoelectric conversion unit 6, and no gap is generated between the back surface 5b of the module board 5 and the heat radiation sheet 71. In addition, when the back surface 5b of the module board 5 and the upper surface 63a of the stage 63 are adhered with a thermally conductive adhesive or the like, separation between the back surface 5b of the module board 5 and the upper surface 63a of the stage 63 is prevented.

The present invention is not limited to the above-described embodiment, and various modifications can be made within a range not changing its essential features. For example, third and fourth fixing screws can be added, provided that the first fixing screw and the second fixing screw are disposed in the above-mentioned region.

What is claimed is:

1. An optical communication module having a photoelectric conversion function, the optical communication module comprising:
   a casing made of metal;
   a board housed in the casing and having an electrical connector at one end thereof;
   a light emitting element mounted on a front surface of the board;
   a driving element mounted on the front surface of the board and driving the light emitting element;
   a holding member mounted on the front surface of the board so as to cover the light emitting element and the driving element;
   an optical fiber optically coupled with the light emitting element;
   an optical member held by the holding member and optically coupling the light emitting element with the optical fiber;
   a plurality of thermal vias which pass through the board and each of which has a first end face exposed on the front surface of the board and a second end face exposed on a back surface of the board; and
   a first fixing screw and a second fixing screw which pass through the board and are screwed into the casing and which press the back surface of the board against a bottom surface of the casing,
   wherein at least one of the thermal vias has the first end face thermally connected to the driving element and the second end face thermally connected to the bottom surface of the casing, and
   wherein the first fixing screw and the second fixing screw are each disposed in a region between the electrical connector and the holding member and on either outer side of the holding member.

2. The optical communication module according to claim 1,
   wherein the first fixing screw and the second fixing screw are disposed line-symmetrically with respect to a center line of the board as a symmetry axis.

3. The optical communication module according to claim 1,
wherein the holding member includes:
a rear face to which an optical connector provided at an end of the optical fiber is connected;
a front face located opposite to the rear face; and
a first side face and a second side face each intersecting the rear face and the front face,
wherein the first fixing screw is disposed in a region between the electrical connector and the front face and in an outer region than the first side face, and
wherein the second fixing screw is disposed in a region between the electrical connector and the front face and in an outer region than the second side face.

4. The optical communication module according to claim 2,
wherein the holding member includes:
a rear face to which an optical connector provided at an end of the optical fiber is connected;
a front face located opposite to the rear face; and
a first side face and a second side face each intersecting the rear face and the front face,
wherein the first fixing screw is disposed in a region between the electrical connector and the front face and in an outer region than the first side face, and
wherein the second fixing screw is disposed in a region between the electrical connector and the front face and in an outer region than the second side face.

5. The optical communication module according to claim 1, further comprising:
a heat conductive material interposed between the back surface of the board and the bottom surface of the casing.

6. The optical communication module according to claim 2, further comprising:
a heat conductive material interposed between the back surface of the board and the bottom surface of the casing.

7. The optical communication module according to claim 3, further comprising:
a heat conductive material interposed between the back surface of the board and the bottom surface of the casing.

8. The optical communication module according to claim 4, further comprising:
a heat conductive material interposed between the back surface of the board and the bottom surface of the casing.

9. The optical communication module according to claim 1, further comprising:
a light receiving element mounted on the front surface of the board; and
an amplifying element mounted on the front surface of the board and amplifying an electric signal output from the light receiving element,
wherein the holding member is mounted on the front surface of the board so as to cover the light emitting element, the driving element, the light receiving element, and the amplifying element, and
wherein the plurality of thermal vias include at least one thermal via in which the first end face is thermally connected to the amplifying element and the second end face is thermally connected to the bottom surface of the casing.

10. The optical communication module according to claim 2, further comprising:
a light receiving element mounted on the front surface of the board; and
an amplifying element mounted on the front surface of the board and amplifying an electric signal output from the light receiving element,
wherein the holding member is mounted on the front surface of the board so as to cover the light emitting element, the driving element, the light receiving element, and the amplifying element, and
wherein the plurality of thermal vias include at least one thermal via in which the first end face is thermally connected to the amplifying element and the second end face is thermally connected to the bottom surface of the casing.

11. The optical communication module according to claim 3, further comprising:
a light receiving element mounted on the front surface of the board; and
an amplifying element mounted on the front surface of the board and amplifying an electric signal output from the light receiving element,
wherein the holding member is mounted on the front surface of the board so as to cover the light emitting element, the driving element, the light receiving element, and the amplifying element, and
wherein the plurality of thermal vias include at least one thermal via in which the first end face is thermally connected to the amplifying element and the second end face is thermally connected to the bottom surface of the casing.

12. The optical communication module according to claim 4, further comprising:
a light receiving element mounted on the front surface of the board; and
an amplifying element mounted on the front surface of the board and amplifying an electric signal output from the light receiving element,
wherein the holding member is mounted on the front surface of the board so as to cover the light emitting element, the driving element, the light receiving element, and the amplifying element, and
wherein the plurality of thermal vias include at least one thermal via in which the first end face is thermally connected to the amplifying element and the second end face is thermally connected to the bottom surface of the casing.

13. The optical communication module according to claim 5, further comprising:
a light receiving element mounted on the front surface of the board; and
an amplifying element mounted on the front surface of the board and amplifying an electric signal output from the light receiving element,
wherein the holding member is mounted on the front surface of the board so as to cover the light emitting element, the driving element, the light receiving element, and the amplifying element, and
wherein the plurality of thermal vias include at least one thermal via in which the first end face is thermally connected to the amplifying element and the second end face is thermally connected to the bottom surface of the casing.

14. The optical communication module according to claim 6, further comprising:
a light receiving element mounted on the front surface of the board; and an amplifying element mounted on the front surface of the board and amplifying an electric signal output from the light receiving element, wherein the holding member is mounted on the front surface of the board so as to cover the light emitting element, the driving element, the light receiving element, and the amplifying element, and wherein the plurality of thermal vias include at least one thermal via in which the first end face is thermally connected to the amplifying element and the second end face is thermally connected to the bottom surface of the casing.

15. The optical communication module according to claim 7, further comprising:
    a light receiving element mounted on the front surface of the board; and
    an amplifying element mounted on the front surface of the board and amplifying an electric signal output from the light receiving element,
    wherein the holding member is mounted on the front surface of the board so as to cover the light emitting element, the driving element, the light receiving element, and the amplifying element, and
    wherein the plurality of thermal vias include at least one thermal via in which the first end face is thermally connected to the amplifying element and the second end face is thermally connected to the bottom surface of the casing.

16. The optical communication module according to claim 8, further comprising:
    a light receiving element mounted on the front surface of the board; and
    an amplifying element mounted on the front surface of the board and amplifying an electric signal output from the light receiving element,
    wherein the holding member is mounted on the front surface of the board so as to cover the light emitting element, the driving element, the light receiving element, and the amplifying element, and
    wherein the plurality of thermal vias include at least one thermal via in which the first end face is thermally connected to the amplifying element and the second end face is thermally connected to the bottom surface of the casing.

\* \* \* \* \*